(12) United States Patent
Butcher (10) Patent No.: US 9,045,824 B2
(45) Date of Patent: Jun. 2, 2015

(54) MIGRATION AND PLASMA ENHANCED CHEMICAL VAPOR DEPOSITION

(71) Applicant: Kenneth Scott Alexander Butcher, Thunder Bay (CA)

(72) Inventor: Kenneth Scott Alexander Butcher, Thunder Bay (CA)

( * ) Notice: Subject to any disclaimer, the term of this patent is extended or adjusted under 35 U.S.C. 154(b) by 0 days.

(21) Appl. No.: 13/748,458

(22) Filed: Jan. 23, 2013

(65) Prior Publication Data

US 2014/0037865 A1 Feb. 6, 2014

Related U.S. Application Data

(63) Continuation of application No. 12/703,713, filed on Feb. 10, 2010, now Pat. No. 8,580,670.

(60) Provisional application No. 61/185,953, filed on Jun. 10, 2009.

(30) Foreign Application Priority Data

Feb. 11, 2009 (CA) ..................................... 2653581

(51) Int. Cl.
| | |
|---|---|
| *H01L 21/31* | (2006.01) |
| *H01L 21/469* | (2006.01) |
| *C23C 16/452* | (2006.01) |
| *C23C 16/30* | (2006.01) |
| *C30B 25/10* | (2006.01) |
| *C30B 25/16* | (2006.01) |

(Continued)

(52) U.S. Cl.
CPC .............. *C23C 16/452* (2013.01); *C23C 16/303* (2013.01); *C30B 25/105* (2013.01); *C30B 25/165* (2013.01); *H01J 37/32357* (2013.01); *H01J 2237/3321* (2013.01); *C23C 16/45523* (2013.01)

(58) Field of Classification Search
None
See application file for complete search history.

(56) References Cited

U.S. PATENT DOCUMENTS

| 4,614,961 A | 9/1986 | Khan et al. |
| 4,616,248 A | 10/1986 | Khan et al. |

(Continued)

FOREIGN PATENT DOCUMENTS

| EP | 0525297 A2 | 2/1993 |
| EP | 0525297 A3 | 10/1993 |

(Continued)

OTHER PUBLICATIONS

Koleske, et al. growth model for GaN with comparison structural, optical, and electrical properties. J Appl Phys. 1998; 84(4):1998-2010.

(Continued)

*Primary Examiner* — Calvin Choi
(74) *Attorney, Agent, or Firm* — Kilpatrick Townsend & Stockton LLP (57) ABSTRACT

A method of producing a thin film using plasma enhanced chemical vapor deposition, including the steps of supplying a cation species to a substrate region when there is at most a relatively low flux of a plasma based anion species in the substrate region, and supplying the plasma based anion species to the substrate region when there is at most a relatively low flux of the cation species in the substrate region. This enables delivery of gaseous reactants to be separated in time in PECVD and/or RPECVD based film growth systems, which provides a significant reduction in the formation of dust particles for these plasma based film growth techniques.

18 Claims, 7 Drawing Sheets

(51) Int. Cl.
*H01J 37/32* (2006.01)
*C23C 16/455* (2006.01)

(56) References Cited

U.S. PATENT DOCUMENTS

| | | | |
|---|---|---|---|
| 4,830,702 A | 5/1989 | Singh et al. | |
| 4,902,643 A | 2/1990 | Shimawaki | |
| 4,918,033 A | 4/1990 | Bartha et al. | |
| 5,102,694 A | 4/1992 | Taylor et al. | |
| 5,133,986 A | 7/1992 | Blum et al. | |
| 5,614,055 A | 3/1997 | Fairbairn et al. | |
| 5,916,365 A | 6/1999 | Sherman | |
| 6,001,173 A | 12/1999 | Bestwick et al. | |
| 6,015,590 A | 1/2000 | Suntola et al. | |
| 6,138,606 A * | 10/2000 | Ling | 118/723 E |
| 6,189,485 B1 | 2/2001 | Matsuda et al. | |
| 6,197,683 B1 | 3/2001 | Kang et al. | |
| 6,200,893 B1 | 3/2001 | Sneh | |
| 6,305,314 B1 | 10/2001 | Sneh et al. | |
| 6,342,277 B1 | 1/2002 | Sherman | |
| 6,427,623 B2 | 8/2002 | Ko | |
| 6,444,039 B1 | 9/2002 | Nguyen | |
| 6,451,695 B2 | 9/2002 | Sneh | |
| 6,610,169 B2 | 8/2003 | Nguyen et al. | |
| 6,616,986 B2 | 9/2003 | Sherman | |
| 6,689,220 B1 | 2/2004 | Nguyen | |
| 6,690,042 B2 | 2/2004 | Khan et al. | |
| 6,756,318 B2 | 6/2004 | Nguyen et al. | |
| 6,764,888 B2 | 7/2004 | Khan et al. | |
| 6,838,125 B2 | 1/2005 | Chung et al. | |
| 6,856,005 B2 | 2/2005 | Yoshikawa et al. | |
| 6,878,593 B2 | 4/2005 | Khan et al. | |
| 6,998,014 B2 | 2/2006 | Chen et al. | |
| 7,192,849 B2 | 3/2007 | Fareed et al. | |
| 7,235,484 B2 | 6/2007 | Nguyen et al. | |
| 7,268,375 B2 | 9/2007 | Shur et al. | |
| 7,291,360 B2 | 11/2007 | Hanawa et al. | |
| 7,326,963 B2 | 2/2008 | Gaska et al. | |
| 7,348,606 B2 | 3/2008 | Khan et al. | |
| 7,361,387 B2 | 4/2008 | Nguyen | |
| 7,442,615 B2 | 10/2008 | Nguyen et al. | |
| 7,491,626 B2 | 2/2009 | Gaska et al. | |
| 7,537,950 B2 | 5/2009 | Gaska et al. | |
| 7,553,368 B2 | 6/2009 | Butcher et al. | |
| 7,691,757 B2 | 4/2010 | Haukka et al. | |
| 7,713,592 B2 | 5/2010 | Nguyen et al. | |
| 7,867,905 B2 | 1/2011 | Nguyen et al. | |
| 8,501,624 B2 * | 8/2013 | Koo et al. | 438/689 |
| 2001/0028924 A1 | 10/2001 | Sherman | |
| 2002/0005566 A1 | 1/2002 | Weber et al. | |
| 2003/0049916 A1 | 3/2003 | Surya et al. | |
| 2003/0215570 A1 | 11/2003 | Seutter et al. | |
| 2005/0223986 A1 | 10/2005 | Choi et al. | |
| 2006/0021574 A1 | 2/2006 | Armour et al. | |
| 2006/0174815 A1 | 8/2006 | Butcher et al. | |
| 2006/0177579 A1 | 8/2006 | Shin et al. | |
| 2006/0252240 A1 | 11/2006 | Gschwandtner et al. | |
| 2007/0116872 A1 | 5/2007 | Li et al. | |
| 2007/0116887 A1 | 5/2007 | Faguet | |
| 2007/0141258 A1 | 6/2007 | Fareed et al. | |
| 2007/0186853 A1 | 8/2007 | Gurary et al. | |
| 2007/0215036 A1 | 9/2007 | Park et al. | |
| 2008/0113110 A1* | 5/2008 | Elers et al. | 427/577 |
| 2008/0173735 A1 | 7/2008 | Mitrovic et al. | |
| 2008/0272463 A1 | 11/2008 | Butcher | |
| 2008/0282978 A1 | 11/2008 | Butcher et al. | |
| 2009/0020768 A1 | 1/2009 | Butcher et al. | |
| 2009/0090984 A1 | 4/2009 | Khan et al. | |
| 2009/0104376 A1 | 4/2009 | Choi et al. | |
| 2009/0238997 A1 | 9/2009 | De Vries et al. | |

FOREIGN PATENT DOCUMENTS

| | | |
|---|---|---|
| EP | 2017884 A2 | 1/2009 |
| JP | 59150417 | 8/1984 |
| JP | 2005229013 | 8/2005 |
| KR | 20050108772 | 11/2005 |
| KR | 20070109453 | 11/2007 |
| WO | WO 03/097532 A1 | 11/2003 |
| WO | WO 2004/079031 A2 | 9/2004 |
| WO | WO 2004/079031 A3 | 12/2004 |
| WO | WO 2006/034540 A1 | 4/2006 |
| WO | WO 2007/002672 A2 | 1/2007 |
| WO | WO 2007/139379 A1 | 12/2007 |
| WO | WO 2008/048704 A2 | 4/2008 |
| WO | WO 2008/048704 A3 | 7/2008 |
| WO | WO 2009/002365 A1 | 12/2008 |
| WO | WO 2007/139379 A9 | 1/2009 |
| WO | WO 2010/022064 A1 | 2/2010 |
| WO | WO 2010/091470 A1 | 8/2010 |

OTHER PUBLICATIONS

Liu, et al. On the kinetics of growth of highly defective GaN epilayers and the origin of the deep trap responsible for the yellow-band luminescence. Appl Phys Lett. 1997; 71(3):347-349.

Fareed, et al. High quality InN/GaN heterostructures grown by migration enhance metalorganic chemical vapor deposition. Applied Physics Letters. 2004;84(11):1892-1894.

Hoke, et al. Evaluation of a new plasma source for molecular beam epitaxial growth of InN and GaN films. Journal of Crystal Growth. 1991;111:1024-1028.

Horikoshi, et al. Advanced epitaxial growth techniques: atomic layer epitaxy and migration-enhanced epitaxy. Journal of Crystal Growth. 1999; 201-202:150-158.

Horikoshi, et al. Low-temperature Growth of GaAs and AlAs-GaAs Quantum-Well Layers by Modified Molecular Beam Epitaxy. Jpn J. Appl. Phys. 1986;25:L868-L870.

Horikoshi, et al. Migration-enhanced epitaxy of GaAs and AlGaAs. Japanese Journal of Applied Physics. 1988;27(2):169-179.

Horikoshi, et al. Migration-enhanced epitaxy of GaAs and AlGaAs. Semicond. Sci. Technol. 1993;8:1032-1051.

International search report dated Sep. 28, 2010 for PCT Application No. IB2010/000390.

Johnson, et al. Growth of GaN, InGaN, and AlGaN films and quantum well structures by molecular beam epitaxy. Journal of Crystal Growth. 1997;175-176:72-78.

Kobayashi, et al. Flow-rate modulation epitaxy of GaAs. Japanese Journal of Applied Physics. 1985;24(12):L962-L964.

Kusakabe, et al. Reduction of threading dislocations in migration enhanced epitaxy grown GaN with N-polarity by use of AlN multiple interlayer. Journal of Crystal Growth. 2001;230:387-391.

Lu, et al. Improvement on epitaxial grown of InN by migration enhanced epitaxy. Applied Physics Letters. 2000. 2000; 77(16):2548-2550.

Sugihara, et al. High-quality GaN on AlN multiple intermediate layer with migration enhanced epitaxy by RF-molecular beam epitaxy. Japanese Journal of Applied Physics. 2000; 39:L197-L199.

Zhang, et al. Pulsed atomic layer epitaxy of quaternary AlInGaN layers for ultraviolet light emitters. Physics Status Solidi (A), Applied Research. 2001; 188(1):95-99.

Doolittle, et al. Extremely high hole concentrations in C-Plane GaN. Abstract presented at IWN2008 International Workshop on Nitride semiconductors. Oct. 6-10, 2008; p. 218. Montreux, Switzerland.

Wintrebert-Fouquet, et al. Nitride film growth morphology using remote plasma enhanced chemical vapor deposition. Physics Status Solidi C. 2007; 4(7): 2285-2288.

Yamguchi, et al. Novel InN growth method under In-rich condition on GaN/$Al_2O_3$ (0001) templates. Abstract presented at IWN2008 International Workshop on Nitride semiconductors. Oct. 6-10, 2008; p. 81. Montreux, Switzerland.

Yodo, et al. Influence of insert nitrogen modules, nitrogen radical atoms and nitrogen molecular ions on growth process and crystal structure of GaN heteroepitaxial layers grown on Si(001) and Si(111) substrates by molecular-beam epitaxy assisted by electronic cyclotron resonance. Proc. Int. Workshop (Sep. 24 to 27, 2000) on Nitride Semiconductors. IPAP conf. Series 1. 351-354.

* cited by examiner

Activated Nitrogen              GaN Reaction

MIGRATION AND PLASMA ENHANCED CHEMICAL VAPOR DEPOSITION

CROSS-REFERENCE

This application is a continuation of U.S. patent application Ser. No. 12/703,713, filed Feb. 10, 2010, which claims the benefit of Canadian Patent Application No. 2653581, entitled "Migration and plasma enhanced chemical vapour deposition", filed on Feb. 11, 2009, and U.S. Provisional Patent Application No. 61/185,953, entitled "Migration and plasma enhanced chemical vapour deposition", filed on Jun. 10, 2009, which are entirely incorporated herein by reference.

TECHNICAL FIELD

The present invention generally relates to the field of thin films, and more specifically to a method of and/or device for thin film crystal growth using plasma enhanced chemical vapor deposition, which may be remote plasma enhanced chemical vapor deposition.

BACKGROUND OF THE INVENTION

Presently, inadvertent dust formation is a major problem facing many known techniques of thin film crystal growth that involve a gas or vapor phase reactant, including chemical vapor deposition (CVD) methods, such as metalorganic chemical vapor deposition (MOCVD), plasma enhanced chemical vapor deposition (PECVD), and remote plasma enhanced chemical vapor deposition (RPECVD), and physical forms of thin film deposition such as reactive sputtering and reactive evaporation.

Similarly, HVPE (sometimes called hydride vapor phase epitaxy or halide vapor phase epitaxy) can be affected by dust formation. Dust formation occurs when reactions take place in the gas phase between the reacting species, instead of on the surfaces of the "substrates" on which the films are intentionally grown. Molecules formed in the gas phase coalesce into larger dust particles. Dust formation is often the result of parasitic gas phase reactions and is an unwanted effect during thin film growth. Dust formation can cause dust to build up on the walls of a reaction chamber so that the reactor chamber eventually requires down time for cleaning. In severe cases the dust can be incorporated in the film itself, or no film may grow because dust formation is entirely prevalent.

There are some known techniques to attempt to reduce the formation of such parasitic dust by suppressing the gas phase reactions that lead to dust formation. For example by chemical means, although chemical techniques that suppress parasitic gas phase reactions can have the unwanted effect of also suppressing the reactions that cause film growth on a substrate. Another means of attempting to suppress dust formation is to reduce the density of the reacting species in the gas phase of a film growth region. This is done so that the individual molecules or other reacting species are less likely to collide with one and other and undergo a chemical interaction before reaching the substrate, though this can have the unwanted effect of lowering the film growth rate. It may also be possible to lower the temperature of the gas so that parasitic reactions in the gas phase are less prevalent, but this is not always easily achieved above a heated substrate, or with plasma heating present.

For the film growth techniques of PECVD and RPECVD, in particular, it has been observed by the inventor that the high delivery rates for reactant species that would otherwise lead to high growth rates is not possible due to severe dust formation. Hence these known techniques are limited in terms of their potential film growth rates.

There is thus a need for a method and/or device that addresses or at least ameliorates one or more problems inherent in current systems and methods.

The reference in this specification to any prior publication (or information derived from the prior publication), or to any matter which is known, is not, and should not be taken as an acknowledgment or admission or any form of suggestion that the prior publication (or information derived from the prior publication) or known matter forms part of the common general knowledge in the field of endeavor to which this specification relates.

SUMMARY OF THE INVENTION

According to one aspect, the present invention seeks to reduce the formation of dust during thin film growth by relatively high pressure thin film growth techniques, for example, operating approximately over a range of 0.1 mTorr to 10 Torr.

Preferably, delivery of gaseous reactants is separated in time in plasma enhanced chemical vapor deposition (PECVD) and/or remote plasma enhanced chemical vapor deposition (RPECVD) based film growth systems, which provides a significant reduction in the formation of dust particles for these plasma based film growth techniques.

According to a first example form, there is provided a method of producing a thin film using plasma enhanced chemical vapor deposition (reference to which includes both PECVD and RPECVD), including the steps of: supplying a cation species to a substrate region when there is at most a relatively low flux of a plasma based anion species in the substrate region; and, supplying the plasma based anion species to the substrate region when there is at most a relatively low flux of the cation species in the substrate region.

According to a second example form, there is provided a method of thin film crystal growth using plasma enhanced chemical vapor deposition, including the step of intermittently modulating the supply of a cation species and an anion species to a substrate region.

In another aspect of the invention, a method for forming a Group III metal nitride thin film over a substrate in a reaction chamber is provided, comprising alternately and sequentially pulsing into the reaction chamber a Group III metal precursor and plasma-activated species of nitrogen, each pulse of the Group III metal precursor forming a non-self limiting layer of a Group III metal over the substrate.

Reference to supply of a cation species or an anion species can be read as also referring to supply of a cation species precursor or an anion species precursor. In an embodiment, cation species can include Group III metal precursors, such as, e.g., metalorganic species (also "organometallic species" and "metal organic species" herein). In an embodiment, anion species can include active neutral species of $N_2$.

Reference to modulating the supply of the cation species or the anion species to a substrate region can be read as encompassing any means of achieving such an effect. For example, modulating the supply of a species could be achieved by: a pressure of a species could be modified at or remote to the substrate region; a flow rate of injecting a species into a chamber could be modified; an evaporation rate of a species could be modified; a physical, electric or magnetic barrier could be used to modulate flux of a species between distinct areas; a pressure of a background gas, if present, could be modified; a plasma excitation source could be modified such as pulsed on or off; combinations of the foregoing; and/or various other mechanisms.

Reference to intermittently modulating the supply of the species can be read as any form of intermittent, periodic, interspersed, pulsed, or the like, modulation of two or more species. In a preferred example, modulation of the supply of each species is out of phase so that a maximum rate of supply of a first species is intermittent to a maximum rate of supply of a second species. The period, frequency and amplitude for modulation of each species can be independently changed as desired.

INCORPORATION BY REFERENCE

All publications (e.g., scientific publications, engineering publications), patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

While embodiments of the invention are shown and described herein, it will be obvious to those skilled in the art that such embodiments are provided by way of example only. Numerous variations, changes, and substitutions will be apparent to those skilled in the art without departing from the scope of the invention. It shall be understood that such alternatives to embodiments of the invention described herein are considered as part of the invention.

The following modes, given by way of example only, are described in order to provide a more precise understanding of the subject matter of preferable embodiments of the invention.

In a preferable embodiment, plasma enhanced chemical vapor deposition (PECVD) and remote plasma enhanced chemical vapor deposition (RPECVD) based film growth systems are utilized (herein collectively referred to as plasma enhanced chemical vapor deposition, or PECVD), for example in the growth of compound semiconductors and insulators, and the gas phase delivery of the reactants is separated in time. This provides a significant reduction in the formation of dust particles for these plasma based film growth techniques. PECVD and RPECVD are generally used at relatively low temperatures compared to thermal growth techniques such as metalorganic chemical vapor deposition (MOCVD), and crystal quality can be problematic at such low growth temperatures.

Methods and systems of embodiments of the invention advantageously reduce, if not eliminate, problems associated with dust formation and gas phase contamination during thin film formation. Methods and systems of embodiments of the invention can be used to form improved devices.

In certain embodiments, a Group III metal precursor and active neutral species of $N_2$ are alternately and sequentially pulsed into a reaction chamber to form a Group III metal nitride film over a substrate. In an embodiment, each pulse of the Group III metal precursor forms a non-self limiting layer of a Group III metal, which can be subsequently contacted with active neutral species of $N_2$ to form a Group III metal nitride thin film.

"Metal nitride" can refer to a material comprising one or more metals or one or more semiconductors, and nitrogen. In certain embodiments, a metal nitride (e.g., metal nitride thin film) can have the formula $M_xN_y$, wherein 'M' designates a metal or a semiconductor, 'N' designates nitrogen, and 'x' and 'y' are numbers greater than zero. In some embodiments, a metal nitride can have the formula $M_zN_{1-z}$, wherein 'z' is a number greater than zero and less than 1. In some embodiments, 'M' can comprise one or more metals and/or semiconductors. In embodiments, $M_xN_y$ refers to a metal nitride, such as a Group III metal nitride (e.g., gallium nitride, indium nitride, aluminum gallium nitride). In some embodiments, a metal nitride film or thin film can comprise other materials, such as, e.g., chemical dopants. Chemical dopants can include p-type dopants (e.g., Magnesium, Zinc) and n-type dopants (e.g., Silicon, oxygen).

"Plasma excited species" can refer to radicals, ions (cations, anions) and other excited species generated via application (or coupling) of energy to a reactant gas or vapor. Energy can be applied via a variety of methods, such as, e.g., induction, ultraviolet radiation, microwaves and capacitive coupling. The plasma generator may be a direct plasma generator (i.e., direct plasma generation) or a remote plasma generator (i.e., remote plasma generation). In the absence of coupling energy, plasma generation is terminated. Plasma-excited species include, without limitation, nitrogen radicals, nitrogen ions, and active neutral species of nitrogen. The source of plasma activated species may include, without limitation, $N_2$, $NH_3$, and/or hydrazine. For remote plasma generation, plasma-excited species of a particular vapor phase chemical (e.g., nitrogen containing plasma species) can be formed in a plasma generator in fluid communication with a reaction chamber having a substrate to be processed.

"Adsorption" can refer to chemical attachment of atoms or molecules on a surface "Substrate" can refer to any workpiece on which film or thin film formation is desired. Substrates can include, without limitation, silicon, silica, sapphire, zinc oxide, SiC, AlN, GaN, Spinel, coated silicon, silicon on oxide, silicon carbide on oxide, glass, and indium nitride.

"Surface" can refer to a boundary between the reaction space and a feature of the substrate.

"Cation species" can refer to a chemical, such as a vapor phase chemical, for depositing a metal or metal-containing species on or over a substrate. In embodiments, cation species can be used to deposit Group III metals on a substrate. A cation species can include one or more atoms of a Group III metal desired on a substrate. In an embodiment, cation species can include one or more Group III metals selected from boron (B), aluminum (Al), gallium (Ga) and indium (In). In various embodiments, the cation species is a Group III metal precursor (also "Group III metal-containing reactant" herein). In certain embodiments, the Group III metal precursor is a metalorganic species. In an embodiment, the Group III metal precursor can be trimethyl gallium or triethyl gallium. In embodiments, cation species are used to form a Group III metal nitride thin film, $M_xN_y$, wherein 'M' is a Group III metal, 'N' is nitrogen, and 'x' and 'y' are numbers greater than zero. The cation species can provide the Group III metal (M) for forming the metal nitride layer. In certain embodiments, 'M' can be a cation.

"Anion species" can refer to a chemical, such as a vapor or gas phase chemical, for providing nitrogen and/or oxygen to a metal on or over a substrate. In embodiments, anion species can be used to provide oxygen and/or nitrogen to a Group III metal on a substrate. In other embodiments, anion species can include mixtures of anions and noble gases, such as argon or neon, for providing oxygen and/or nitrogen to a Group III metal on a substrate. In embodiments, anion species can include active neutral species of nitrogen ($N_2$) (also "plasma-activated species of nitrogen" herein), which can be formed using a plasma generator.

Thin Film Growth

In an aspect of the invention, methods for forming thin films are provided. Methods of embodiments of the invention can be used to form Group III metal nitride thin films or layers. Group III metal thin films of embodiments of the invention can include one or more of boron (B), aluminum (Al), gallium (Ga), indium (In) and Thallium (Tl). In an embodiment, Group III metal thin films can comprise gallium nitride. In another embodiment, Group III metal thin films can comprise InN. In another embodiment, Group III metal thin films can comprise AlN. In another embodiment, Group III metal thin films can comprise alloys of GaN, AlN, and/or InN, such as InGaN, AlGaN, and/or AlInGaN.

In embodiments, a method of thin film crystal growth using plasma enhanced chemical vapor deposition includes intermittently modulating the supply of a cation species and an anion species to a substrate region. In certain embodiments, modulating the supply of a cation species and an anion species comprises pulsing cation species and anion species to a substrate region.

In embodiments, a method of producing a thin film using plasma enhanced chemical vapor deposition is provided, comprising the steps of supplying a cation species to a substrate region when there is at most a relatively low flux of a plasma based anion species in the substrate region, and supplying the plasma based anion species to the substrate region when there is at most a relatively low flux of the cation species in the substrate region.

Reference will now be made to the figures, wherein like numerals refer to like parts throughout. It will be appreciated that the figures and structures therein are not necessarily drawn to scale.

Figure 1:
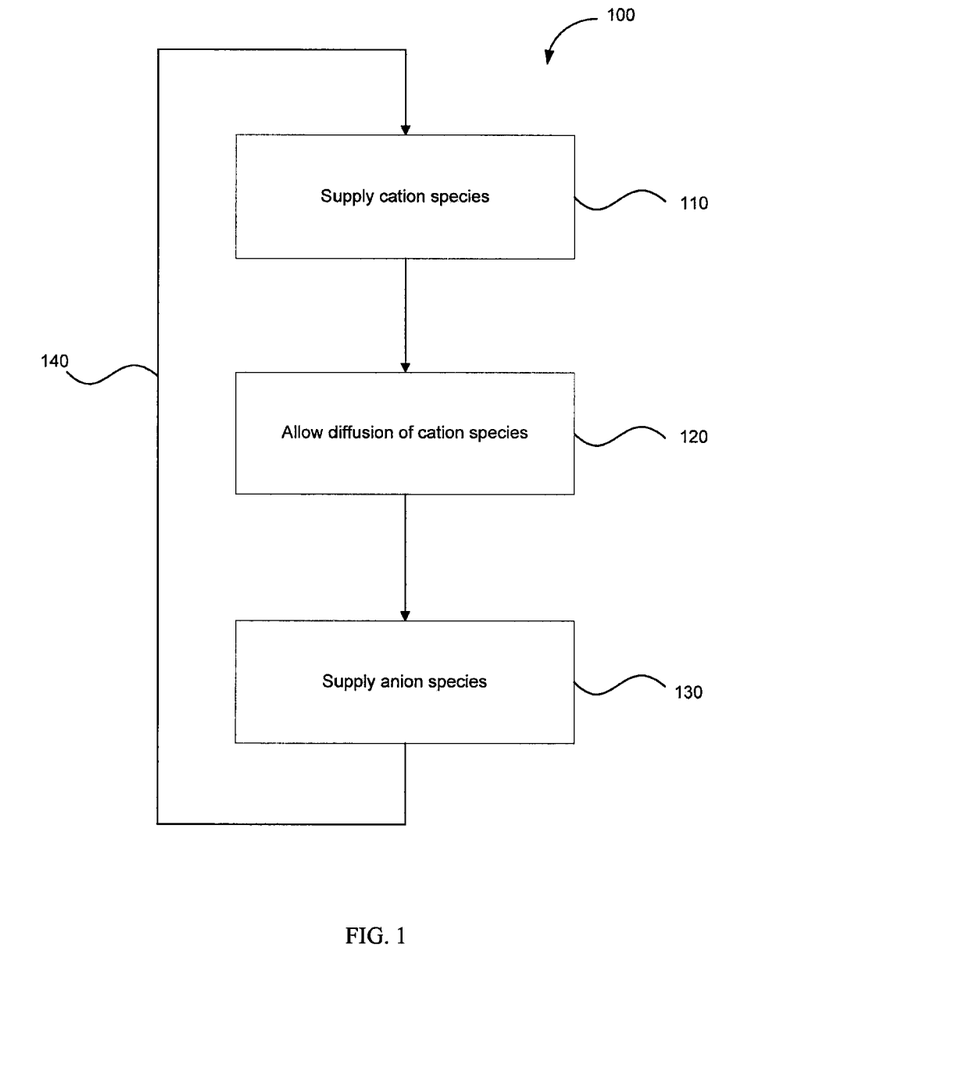
FIG. 1 illustrates a method for producing a thin film using plasma enhanced chemical vapor deposition, in accordance with an embodiment of the invention.

With reference to FIG. 1, there is illustrated a method 100 for producing a thin film using plasma enhanced chemical vapor deposition. At step 110, a cation species is supplied to a substrate (i.e., sample) region (for thin film growth on a substrate) with no, or a relatively low flux of a plasma based anion species being present. A relatively low flux can depend on specific chemistry of the species, but as an example could be between 0% and perhaps 50% of the normal or maximum flux of a species when supplied for film growth. At step 120, the cations are allowed sufficient time to diffuse on the film/substrate. This can be as part of the time duration when supplying the cations, or as a separate intermediate time delay step. In this way the cation is resident on a film surface long enough to be able to diffuse to an energetically favorable site for good film growth. This lateral growth can result in good quality thin film material at relatively low film growth temperatures. Then at step 130 the cation species flux is significantly reduced or stopped and a plasma based anion species is supplied to the substrate region. The process can be repeated at step 140, as required if necessary, to obtain a desired film thickness. The modulation of the supply of each species is preferably out of phase so that a maximum rate of supply of a first species is intermittent to a maximum rate of supply of a second species. The period, frequency and amplitude for modulation of each species can be independently changed as desired, for example a pulsed period of time for a species could vary significantly between about 1 second and 30 minutes. Thus, method 100 provides a means for migration enhanced epitaxy in a plasma enhanced chemical vapor deposition system.

This novel technique is ideally suited to the growth of some compound semiconductors, such as group III metal nitrides, rare earth nitrides, other nitride compound species and oxide compound species. With the introduction of migration enhanced epitaxy it is also possible to vary the growth conditions for a cation species (e.g., Group III metals including Boron, Aluminum, Gallium, Indium, Thallium) and an anion species (e.g., Nitrogen, Oxygen) separately, which can lead to some gains in improved precursor delivery. Obviously, a wide variety of other reactant species can be used.

In a specific but non-limiting example, the method of achieving migration enhanced epitaxy can be applied to known RPECVD based film growth of group III nitride films, for example the systems described in International Patent Publications WO2006/034540 and WO2003/097532, of which the present inventor is a co-inventor, which are entirely incorporated herein by reference.

An acronym that describes this technique is ME-RPECVD, or migration enhanced RPECVD. However, RPECVD reactors can also be referred to as afterglow reactors, so that the acronym MEAGlow (migration enhanced afterglow), can be used. It should be noted that the technique can also be applied to PECVD systems.

In a specific illustrative example, known RPECVD based film growth methods can be generally used for the growth of good quality gallium nitride films at growth rates of less than 150 nanometers ("nm")/hour. The achievement of higher growth rates is desirable to lower device deposition time, and to thereby allow RPECVD to be more competitive with MOCVD where growth rates as high as 2-3 micrometers ("µm")/hr can be achieved for good quality film growth.

However, achieving higher growth rates for the RPECVD growth of gallium nitride, for instance, is dependent on having a plasma source that produces a higher number of active nitrogen based species in the gas phase. Hence, a more efficient plasma source, capable of increasing the film growth rate, will incur the problem of a higher rate of dust formation. The low temperature growth by RPECVD of good crystalline quality GaN, has also been found to be less consistent than would be desirable. By using a MEAGlow system capable of applying the aforementioned method, both these problems can be addressed.

In a particular illustrative example, a relatively short pulse of the gallium precursor material, trimethylgallium, is delivered at a much higher delivery rate than for normal RPECVD, which would cause the formation of excess gallium on the sample surface. The pulse is of sufficient duration to allow diffusion of the gallium species at the sample surface. A pulse of a remote nitrogen or ammonia plasma can then follow the pulse of metalorganic, to supply the nitrogen species used by RPECVD for film growth. In this way the reactant species are in the gas phase at separate times and dust formation is reduced, while the utilization of higher source flow fluxes allows faster growth rates to be achieved. In a MEAGlow reactor higher film crystallinity than is observed for RPECVD can be achieved as a result of the diffusion of the group III metal component on the substrate surface prior to the delivery of the active nitrogen species.

Thus, the MEAGlow reactor can be used to reduce the formation of dust during thin film growth by relatively high pressure film growth techniques, for example, operating approximately over a range of 0.1 mTorr to 10 Torr, compared to molecular beam epitaxy (MBE) which operates over a range of 0.000001 mTorr to 0.1 mTorr.

In various forms, modulating the supply of the anion species can be by changing a chamber pressure of the plasma. The chamber pressure could be adjusted to optimize a flux of the anion species to the substrate region and/or substrate while the plasma is on. Furthermore, the plasma can operate in continuous or pulsed modes. The chamber pressure may be adjusted to optimize the flux of the cation species to the substrate or substrate region, and to potentially eliminate the need for a carrier gas, so that cation species delivery could be by vapor phase delivery alone.

It should be appreciated that modulating the supply of the cation species or the anion species to the substrate region, which includes the actual substrate, can be achieved by a change in the chamber pressure between the use of the anion species and the cation species, or their respective precursors.

The pressure of the chamber of the cation species, or cation species precursor, can be relatively low to allow for delivery of the metalorganic without a carrier gas, i.e., the metalorganic can be supplied or delivered by vapor phase delivery alone when the chamber pressure is less than the vapor pressure of the cation species or cation species precursor. For supply or delivery of the anion species, the pressure, in a particular region such as for example a chamber housing an electrical source, can be optimized for efficient operation of a hollow cathode source, which operates in a narrow pressure range dependent on the dimensions of the hollow cathode and the power applied.

In embodiments of the invention, a method for producing a Group III metal nitride thin film comprises alternately and sequentially contacting a substrate in a reaction chamber with a Group III metal precursor and an active neutral species of nitrogen. In an embodiment, contacting the substrate with the Group III metal precursor forms a non-self limiting layer of a Group III metal over the substrate.

In an embodiment, the Group III metal precursor can include a vapor phase chemical comprising a Group III metal. In an embodiment, the Group III metal precursor comprises a metalorganic (or organometallic) species.

In an embodiment, the active neutral species of nitrogen comprises nitrogen species having energies less than or equal to 7 eV. In an embodiment, the active neutral species of nitrogen comprises $N_2$ species having the lowest excited state of molecular nitrogen ($A^3\Sigma_u^+$, see FIG. 6).

In embodiments, a method for forming a Group III metal nitride thin film over a substrate comprises contacting the substrate with a Group III metal precursor for a first time period to form a layer of a Group III metal having a thickness greater than 1 monolayer (ML). Next the layer of the Group III metal is contacted with plasma-activated species of nitrogen for a second time period to form a layer (or thin film) of a Group III metal nitride.

In embodiments, the first time period is greater than or equal to 10 seconds, or greater than or equal to 30 seconds, or greater than or equal to 1 minute, or greater than or equal to 10 minutes. In an embodiment, the layer or thin film of the Group III metal nitride has a thickness greater than 1 ML, or greater than or equal to about 2 ML, or greater than or equal to about 5 ML. In an embodiment, the layer or thin film of the Group III metal nitride has a thickness greater than or equal the thickness of a quantum well.

In an embodiment, the plasma-activated species of nitrogen comprises nitrogen species having the lowest excited state of molecular nitrogen ($A^3\Sigma_u^+$).

In embodiments, a method for forming a Group III metal nitride thin film over a substrate in a reaction chamber comprises alternately and sequentially pulsing into the reaction chamber a Group III metal precursor and plasma-activated species of nitrogen, with each pulse of the Group III metal precursor forming a non-self limiting layer of a Group III metal over the substrate. In an embodiment, the plasma-activated species of nitrogen comprises nitrogen species having the lowest excited state of molecular nitrogen ($A^3\Sigma_u^+$). In an embodiment, the non-self limiting layer of the Group III metal has a thickness greater than 1 monolayer (ML). In another embodiment, the non-self limiting layer of the Group III metal has a thickness greater than 2 ML. In an embodiment, plasma-activated species of nitrogen having energies greater than 7 eV are quenched with, or prior to, each pulse of the plasma-activated species of nitrogen.

In other embodiments, a method for forming a Group III metal nitride thin film on a substrate comprises supplying a metalorganic species into a reaction chamber for a first time period to form a layer of a Group III metal having a thickness greater than 1 monolayer (ML). In an embodiment, the layer of the Group III metal is a non-self limiting layer of a Group III metal. Next, the metalorganic species is evacuated from the reaction chamber. In an embodiment, the metalorganic species is evacuated by directing $N_2$ into the reaction chamber. In another embodiment, evacuation can be achieved with the aid of a vacuum system alone or in combination with the use of $N_2$. Next, plasma-activated species of nitrogen are supplied into the reaction chamber for a second time period to form a layer of a Group III metal nitride. In an embodiment, the supply (or feed) of the metalorganic species is terminated before supplying the plasma-activated species of nitrogen into the reaction chamber.

In various embodiments, plasma-activated species of nitrogen are supplied to the reaction chamber by first forming the plasma-activated species of nitrogen with the aid of a plasma generator, and directing a subset of the plasma-activate species of nitrogen to the reaction chamber. In an embodiment, plasma-activated species of nitrogen are formed by supplying nitrogen ($N_2$) gas into the plasma generator. Next, the plasma-activated species of $N_2$ is generated in the plasma generator. In an embodiment, this is achieved by supplying power to the plasma generator. In an embodiment, plasma-activated species of nitrogen having potential energies greater than about 7 eV are quenched and plasma-activated species of nitrogen having potential energies less than or equal to about 7 eV are supplied in the reaction chamber. In an embodiment, the pressures in one or both of the plasma generator and an area downstream of the plasma generator (such as, e.g., the pressure in the reaction chamber) are selected such that plasma-activated species of nitrogen having potential energies greater than about 7 eV are quenched.

Figure 4:
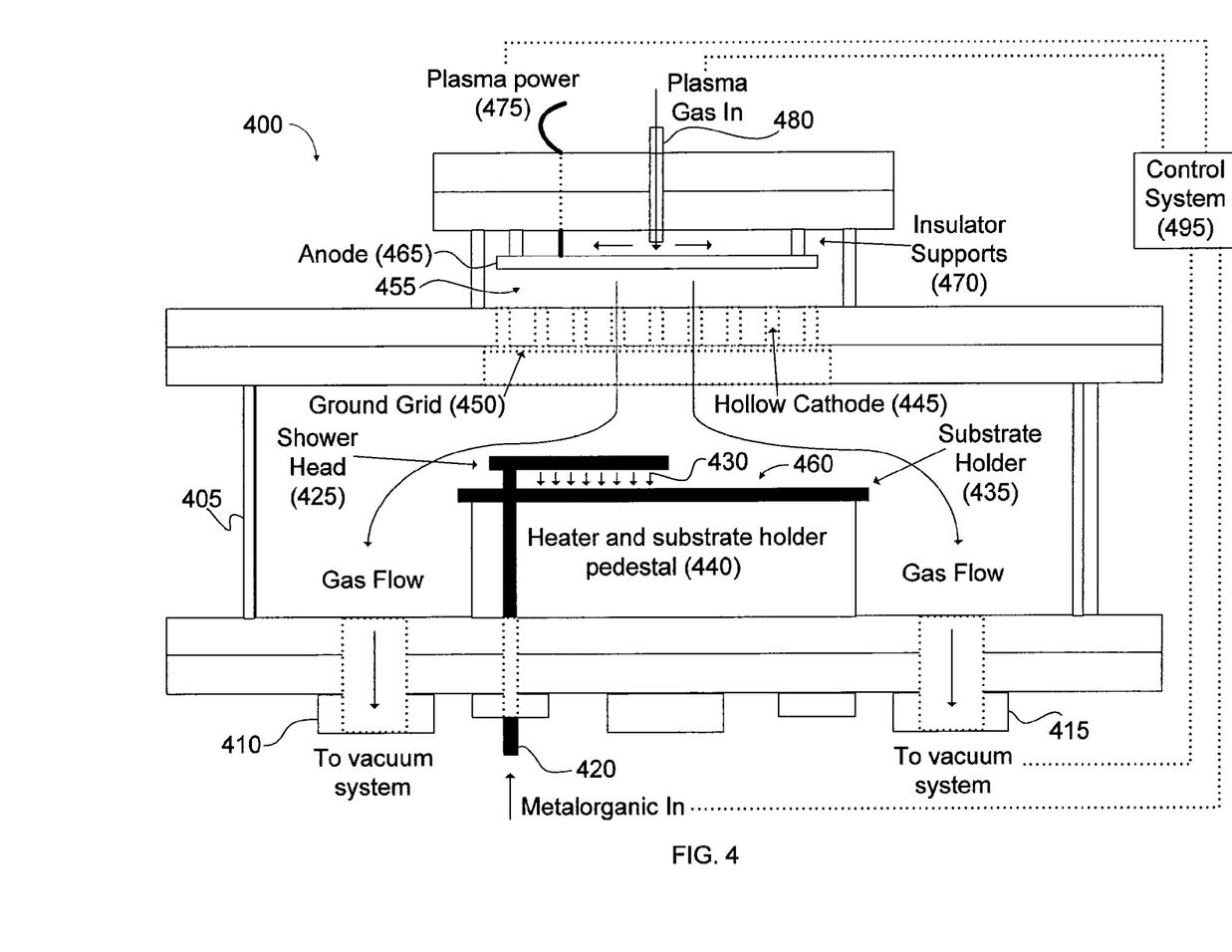
FIG. 4 illustrates a schematic of an example main chamber of a plasma processing reactor, in accordance with an embodiment of the invention.

In various embodiments, the plasma generator comprises a gas distribution member for providing the plasma-activated species of $N_2$ to the reaction chamber (see, e.g., FIG. 4). In an embodiment, the gas distribution member comprises a plurality of holes in a showerhead configuration. In another embodiment, the gas distribution member comprises one or more hollow cathodes. In an embodiment, the plasma generator comprises a hollow cathode configured to generate the plasma-activated species of nitrogen using an electrical source selected form the group consisting of a radiofrequency (RF) source, a lower frequency source, and a direct current (DC) source. In an embodiment, the metalorganic species are supplied to the reaction chamber with the aid of a gas distribution member (such as, e.g., the showerhead of FIG. 5) having a plurality of holes.

In embodiments, the layer of the Group III metal nitride has a thickness greater than 1 monolayer ("ML"), or greater than or equal to about 2 ML, or greater than or equal to about 5 ML. In an embodiment, the layer of the Group III metal nitride has a thickness greater than or equal the thickness of a quantum well.

In an embodiment, the plasma-activated species of nitrogen comprises active neutral nitrogen species having potential energies less then or equal to about 7 eV.

In embodiments, a method for forming a Group III metal nitride thin film over a substrate comprises (a) pulsing one of a Group III metal-containing reactant and plasma-activated species of nitrogen into a reaction chamber; (b) evacuating the reaction chamber; (c) pulsing the other of the Group III metal-containing reactant and plasma-activated species of nitrogen into the reaction chamber; and (d) repeating steps (a)-(c) until a Group III metal nitride thin film of predetermined thickness is formed. In an embodiment, each pulse of the Group III metal-containing reactant forms a non-self limiting layer of a Group III metal on or over the substrate. In various embodiments, each pulse of the Group III metal-containing reactant forms a layer of a Group III metal having a thickness greater than 1 monolayer (ML), or greater than or equal to about 2 ML, or greater than or equal to about 5 ML.

In certain embodiments, the reaction chamber can be evacuated between steps (c) and (d). This reduces, if not eliminates, the gas phase reaction between the Group III metal-containing reactant and plasma-activated species of nitrogen, which advantageously reduces, if not eliminates, dust formation. In an embodiment, after the pulse of the Group III metal-containing reactant, the reaction chamber can be evacuated prior to pulsing the plasma-activated species of nitrogen into the reaction chamber. In another embodiment, after the pulse of the plasma-activated species of nitrogen, the reaction chamber is evacuated prior to pulsing the Group III metal-containing reactant into the reaction chamber. In an embodiment, the reaction chamber can be evacuated with the aid of an inert gas, such as Ar, He, or $N_2$. In another embodiment, the reaction chamber can be evacuated with the aid of a vacuum pumping system, such as a turbomolecular ("turbo") pump backed by a mechanical pump. In another embodiment, the reaction chamber can be evacuated with the aid of an inert gas and a vacuum pumping system.

Figure 2:
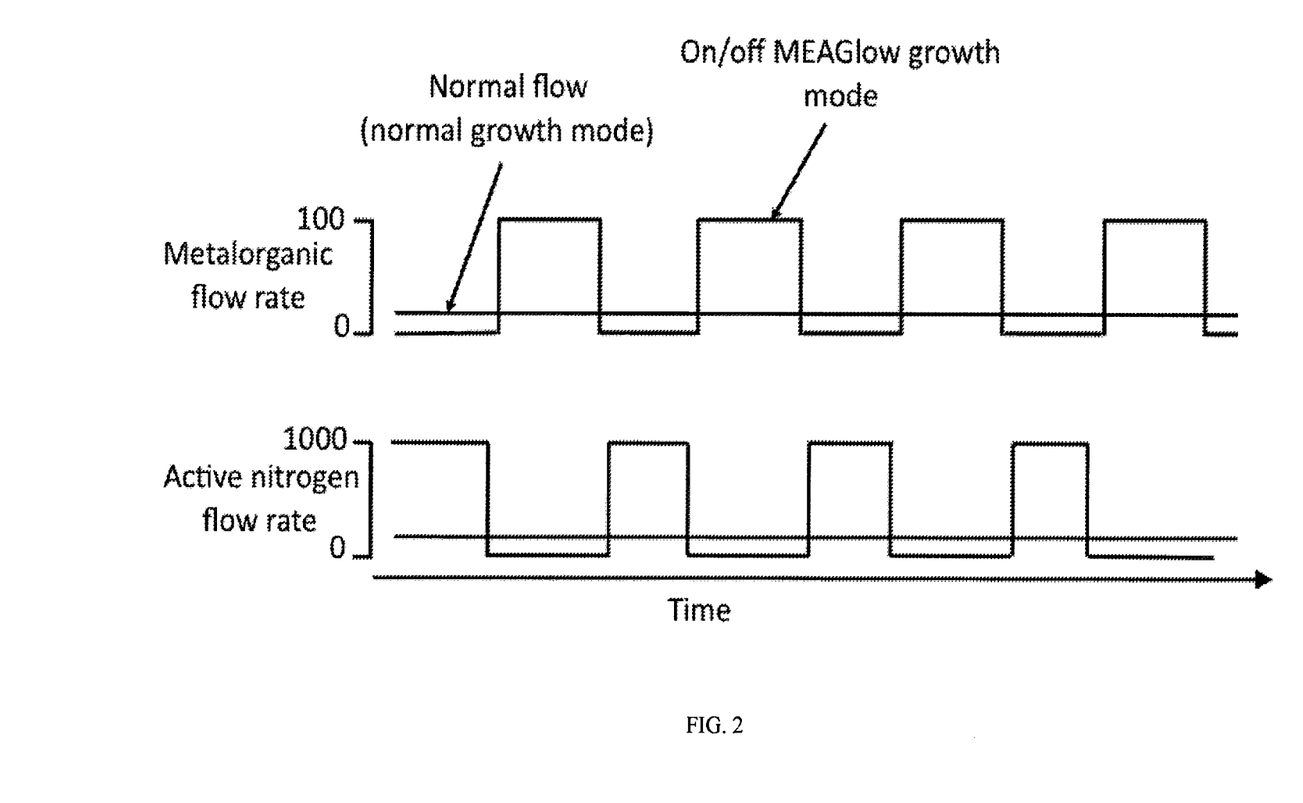
FIG. 2 is a pulsing diagram showing pulses of a metalorganic species and active neutral species of nitrogen ("active nitrogen"), in accordance with an embodiment of the invention.

With reference to FIG. 2, a pulsing sequence (also "pulsing train" herein) for forming a Group III metal nitride thin film is illustrated. FIG. 2 shows an on/off pulsing sequence for a metalorganic species (top) and active neutral nitrogen species (bottom), with flow rates (arbitrary units) shown on the ordinates and time shown on the abscissa. In a preferable embodiment, a pulse of the metalorganic species does not overlap a pulse of the active neutral nitrogen (also "active nitrogen" herein) species. FIG. 2 also illustrates the growth mode during material pulses, designated as "On/off MEAGlow growth mode". The growth mode without material pulsing has also been illustrated (horizontal lines).

With continued reference to FIG. 2, in a first step, a pulse of a metalorganic species (or other vapor phase metal precursor) is provided into a reaction chamber (i.e., metalorganic species pulse turned 'on') having a substrate on which a Group III metal nitride thin film is to be formed. During the pulse of the metalorganic species, the flow rate of active nitrogen is terminated (i.e., active nitrogen is not directed into the reaction chamber). In an embodiment, this includes terminating the supply of $N_2$ gas into a plasma generator in fluid communication with the reaction chamber. The pulse of metalorganic species is provided for a time period and flow rate selected to form a Group III metal thin film of predetermined (or desired) thickness. Next, the flow of the metalorganic species into the reaction chamber is terminated. In a preferable embodiment, the Group III metal thin film formed in the first step is non-self limiting.

Next, the reaction chamber can be optionally evacuated with the aid of an inert gas and/or a vacuum pumping system (see above).

Next, following termination of the flow of the metalorganic species into the reaction chamber, in a second step, active neutral nitrogen is pulsed into the reaction chamber. During the second step, the substrate and metal thin film formed over the substrate are exposed to active nitrogen. In an embodiment, during the second step, at least a portion of the Group III metal thin film reacts with the active nitrogen to form a Group III metal nitride thin film.

Next, the reaction chamber can be evacuated with the aid of an inert gas and/or a vacuum pumping system (see above). In an embodiment, this can entail maintaining the flow of $N_2$ into the reaction chamber but not supplying power to the plasma generator, thus precluding the formation of active neutral nitrogen species.

Next, the first step and the second step, in addition to the evacuation steps, can be repeated until a Group III metal nitride layer or thin film of predetermined (or desired) thickness is formed over the substrate. Various process parameters, such as the duration of each of the metalorganic species and the active neutral nitrogen species pulses, chamber pressure, substrate temperatures and material fluxes, can be adjusted to achieve Group III metal nitride thin films with desired qualities and within a predetermined amount of time.

In various embodiments, with the pulse of a metalorganic species and the pulse of active nitrogen defining a cycle, a thin film can be formed following 2 or more cycles, or 5 or more cycles, or 10 or more cycles, or 20 or more cycles. It will be appreciated that a cycle can include one or more evacuation steps between the metalorganic species pulse and active nitrogen pulse.

In embodiment, the duration of a metalorganic species pulse can be greater than or equal to 10 seconds, or greater than or equal to 30 seconds, or greater than or equal to 1 minute, or greater than or equal to 10 minutes. In embodiments, the duration of an active nitrogen pulse can be greater than or equal to 10 seconds, or greater than or equal to 30 seconds, or greater than or equal to 1 minute, or greater than or equal to 10 minutes.

By alternately and sequentially pulsing into a reaction chamber a Group III metal precursor and active neutral nitrogen species, improved growth rates and thin film properties (quality, device performance) can be achieved. Pulsing methods and systems of embodiments of the invention can advantageously provide for improved growth rates.

Plasma Processing Reactors

In an aspect of the invention, plasma processing reactors (also "plasma reactors" herein) are provided for forming thin films. In embodiments, plasma processing reactors comprise MEAGlow reactors. In embodiments, the plasma processing reactors can be used to form Group III metal nitride thin films or layers, such as, e.g., gallium nitride thin films and indium nitride thin films.

In embodiments of the invention, plasma processing reactors can be used to form active neutral nitrogen species. In an embodiment, plasma processing reactors can be used to form active neutral nitrogen species having potential energies less than or equal to about 7 eV. In an embodiment, plasma processing reactors can be used to form active neutral nitrogen species having the lowest excited state of molecular nitrogen ($A^3\Sigma_u^+$, see FIG. 6). In a preferable embodiment, plasma processing reactors are used to form active neutral nitrogen species from molecular nitrogen ($N_2$).

In an embodiment, a method for forming active neutral nitrogen species, comprises supplying nitrogen ($N_2$) gas into a plasma generator. Next, plasma-activated species of $N_2$ are generated in the plasma generator. In an embodiment, plasma-activated species of $N_2$ includes nitrogen radicals, nitrogen cations and nitrogen anions. In another embodiment, plasma-activated species of $N_2$ includes active neutral species of nitrogen. In a preferable embodiment, plasma-activated species of $N_2$ having potential energies greater than about 7 eV are subsequently quenched. In embodiments, quenching of the higher energy species (e.g., high energy plasma-activated species of $N_2$ having energies greater than 7 eV) can be achieved by controlling the number of gas collisions that such high energy species undergo. In various embodiments, the pressure or pressures in one or both of the plasma generator and an area downstream of the plasma generator (such as, e.g., the pressure in a reaction chamber downstream of the plasma generator) are selected such that plasma-activated species of nitrogen having potential energies greater than about 7 eV are quenched. The distance in which quenching occurs (i.e., the distance high energy species travel before being quenched via collision with other gas phase species) is also dependent on the gas temperature and the flow rate of the gas, so that, in various embodiments, the gas temperature, the gas flow rate and/or the pressure will determine the distance that these species will travel before being quenched. In another embodiment, distance itself can be used to quench species with potential energy higher than 7 eV. In an embodiment, quenching can be achieved by selecting the distance between the plasma generator and the substrate in the reaction chamber. In another embodiment, the pressure in the plasma generator and/or downstream of the plasma generator selected to achieve such quenching (i.e., quenching plasma-activated species of nitrogen having potential energies greater than about 7 eV) is between about 0.1 mTorr and 10 Torr. Next, plasma-activated species of $N_2$ having potential energies less than or equal to about 7 eV, are then supplied to a reaction chamber (also "reactor chamber" and "chamber" herein) having a substrate. The substrate is then exposed to (or contacted with) such plasma-activated species of $N_2$.

In an embodiment, a method for providing active neutral nitrogen ($N_2$) to a reaction chamber comprises supplying nitrogen ($N_2$) gas into a plasma generator. Next, a first group of plasma-activated species of $N_2$ is formed in the plasma generator. A second group of plasma-activated species of $N_2$ is then formed from the first group, the second group comprising active neutral nitrogen species having potential energies less than or equal to about 7 eV. The second group is then directed to the reaction chamber having a substrate. In an embodiment, $N_2$ gas is supplied into the plasma generator at a pressure greater than or equal to about 0.1 mTorr. In another embodiment, $N_2$ gas is supplied into the plasma generator at a pressure greater than or equal to about 0.1 mTorr and less than or equal to 10 Torr.

In embodiments, a reactor for forming Group III metal nitride thin films or layers comprises a reaction chamber and a substrate holder disposed in the reaction chamber, the substrate holder configured to hold a substrate. The reactor further comprises a plasma generator in fluid communication with a nitrogen ($N_2$), ammonia ($NH_3$), and/or hydrazine feed and the reaction chamber, the plasma generator configured to form active neutral species of nitrogen. The reactor further comprises a control system (or computer system) configured to alternately and sequentially provide into the reaction chamber a Group III metal precursor and active neural species of nitrogen. In an embodiment, the control system is configured to rotate a substrate on the substrate holder while the substrate is alternately and sequentially exposed to a Group III metal precursor and active neutral species of nitrogen.

In an embodiment, the control system (such as control system 495 of FIG. 4) is configured to control various process parameters, such as, for example, substrate and/or substrate holder temperature, reactor pressure, reaction chamber pressure, plasma generator pressure, the flow rate of gas (e.g., $N_2$) into the plasma generator, the flow rate of gas (e.g., metalorganic species, active neutral species of nitrogen) into the reaction chamber, the rate at which the substrate rotates during thin film formation, power to the plasma generator (e.g., DC or RF generator), and a vacuum system in fluid communication with the reaction chamber. The vacuum system can comprise various pumps configured to provide vacuum to the reaction chamber, such as, e.g., one or more of a turbomolecular ("turbo") pump, a cryopump, an ion pump and a diffusion, in addition to a backing pump, such as a mechanical pump.

In various embodiments, the plasma generator comprises a gas distribution member for providing active neutral species of nitrogen to the reaction chamber. In an embodiment, the gas distribution member comprises a plurality of holes in a showerhead configuration. In an embodiment, the gas distribution member comprises one or more hollow cathodes. In embodiments, the gas distribution member can be configured to form a group of active neutral species of nitrogen having potential energies less than or equal to about 7 eV. In a preferable embodiment, the plasma generator is configured to filter active neutral species of nitrogen having potential energies greater than about 7 eV to provide into the reaction chamber active neutral species of nitrogen having potential energies less than or equal to about 7 eV. In embodiments, during plasma formation, active nitrogen having the lowest excited state of molecular nitrogen ($A^3\Sigma_u^+$, see FIG. 6) is formed from a vapor or gas, or a plasma mixture of a vapor or gas, comprising various plasma excited species of nitrogen, thereby providing to a reaction chamber active nitrogen species having the lowest excited state of molecular nitrogen ($A^3\Sigma_u^+$). In various embodiments, the pressure in the plasma generator and/or the reaction chamber is selected such that high-energy active neutral species of $N_2$ (i.e., active neutral species of $N_2$ having potential energies higher than the lowest excited state of $N_2$), in addition to other plasma-excited species of nitrogen, are quenched via gas phase collisions. In an embodiment, the plasma generator pressure for providing active neutral species of nitrogen substantially having the lowest excited state of nitrogen ($A^3\Sigma_u^+$) is between about 0.1 mTorr and 10 Torr.

In embodiments, the reactor further comprises a Group III metal precursor feed for directing a Group III metal precursor to the reaction chamber. In an embodiment, the Group III metal precursor feed is disposed adjacent the substrate holder. In an embodiment, the Group III metal precursor feed is disposed between the substrate holder and the plasma generator. In some embodiment, the Group III metal precursor feed covers a portion of the substrate holder.

In other embodiments, the Group III metal precursor feed comprises a hollow head having a narrow end and a wide end, the narrow end configured to be positioned above a central portion of a substrate on the substrate holder, the wide end configured to be positioned above an outer portion of the substrate. In such a case, in an embodiment, a surface of the hollow head facing the substrate holder is provided with a plurality of holes configured to provide a Group III metal precursor to at least a portion of a substrate in the reaction chamber.

In various embodiment, upon supplying power to the plasma generator (e.g., RF generator), plasma excited species of nitrogen, such as active neutral species of nitrogen having various potential energies, nitrogen anions, nitrogen cations, and nitrogen radicals, are formed. Next, active neutral species of nitrogen having potential energies greater than about 7 eV are quenched, and active neutral species of nitrogen having potential energies less than or equal to about 7 eV are provided into the reaction chamber. In an embodiment, such species are quenched via collision with other gas phase species, the walls of the plasma generator, and/or the walls of the reaction chamber. In an embodiment, with the plasma generator pressure selected to be between about 0.1 mTorr and 10 Torr, active neutral species of nitrogen having potential energies greater than about 7 eV, in addition to other plasma excited species of nitrogen, are quenched, and active neutral species of nitrogen having potential energies less than or equal to about 7 eV are provided for distribution to the reaction chamber having the substrate. In an embodiment, the pressure in the plasma generator is adjusted via the flow rate of a nitrogen-containing species into the plasma generator. In an embodiment, the pressure in the reaction chamber can be the same or nearly the same as the pressure in the plasma generator, such that a change in reaction chamber pressure effects a change in the plasma generator pressure, and vice versa.

Figure 3:
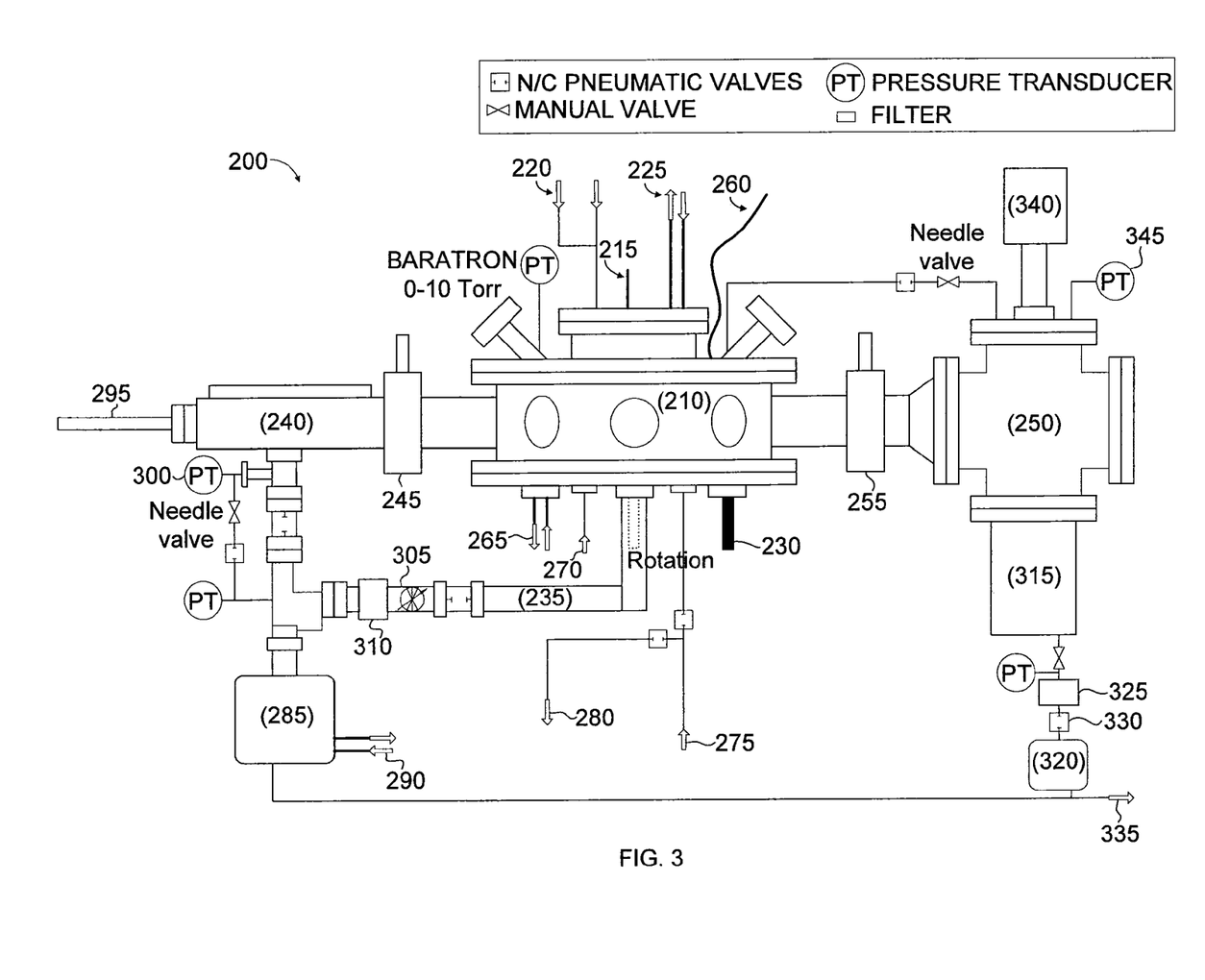
FIG. 3 illustrates a schematic of an example plasma processing reactor, in accordance with an embodiment of the invention.

With reference to FIG. 3, there is illustrated a schematic of an example plasma processing reactor that provides a MEAGlow reactor 200. Main chamber 210 is where reactions between chemical species occurs. A plasma power source 215 creates a contained plasma where plasma species are supplied by plasma supply lines 220. Plasma power source 215 can be cooled by water inlet/outlet 225. Main chamber 210 contains a substrate that can be adjusted in height by pneumatic sample lift 230. The region below the substrate can be connected to pump line 235 to assist in creating a vacuum in main chamber 210. Main chamber 210 is connected to load lock 240 via gate valve 245. Main chamber 210 is also connected to conflat cross 250 via gate valve 255.

An optical omission spectrometer optical fibre (or fiber) 260 can be introduced into main chamber 210 for diagnostic purposes. A further water inlet/outlet 265 and a purge valve 270 are associated with main chamber 210. A metaloraganic inlet 275 supplies a metalorganic species to main chamber 210. A bypass pump 280 is also connected to metalorganic inlet line 275.

Load lock 240 is connected to dry pump 285 with associated water inlet/outlet 290. A transfer arm 295 is associated with load lock 240. Wide range gauge 300 can be used to measure the pressure on dry pump 285 side of load lock 240. Throttle valve 305 and filter 310 connect pump line 235 to dry pump 285.

Conflat cross 250 is connected to a turbo pump 315 which is connected to a backing pump 320 via filter 325 and electrical isolation valve 330. Backing pump 320 and dry pump 285 exhaust gas into exhaust line 335. RGA 340 is connected to conflat cross 250 which can also be provided with an associated wide range gauge 345.

With reference to FIG. 4, there is illustrated a schematic of an example main chamber of a plasma processing reactor providing part of a MEAGlow reactor. Main chamber 400 includes housing 405 enabling a vacuum to be created in main chamber 400. Gas flow outlets 410 and 415 are connected to a vacuum system to remove gases from main chamber 400. Metalorganic species 430 is introduced internally into region 460 of main chamber 400 via metalorganic inlet 420, which is connected to "shower head" feed 425. Shower head (also "showerhead" herein) feed 425 directs metalorganic species 430 onto a substrate, which is held by or placed on substrate holder 435. Substrate holder 435 is supported by, and can be heated by, pedestal 440.

A hollow cathode 445 is provided above a ground grid 450. Gas flows through hollow cathode 445 and ground grid 450 from plasma creation region 455 into reaction region 460, being in the vicinity of the substrate on substrate holder 435.

The hollow cathode 445 can generate a plasma using a variety of electrical sources, for example a radiofrequency ("RF") source, a lower frequency source, a higher frequency source, and/or a DC source. This at least partially enables the plasma to be scalable to a relatively large area.

Anode 465 is supported by insulator supports 470 and attached to power line 475. A plasma based species is introduced into plasma creation region 455 via plasma gas inlet 480. A plasma can thus be created in region 455 that diffuses into region 460 to react with metalorganic species 430 on the substrate.

A standard capacitively coupled plasma can be formed between anode 465 and hollow cathode 445. This can be achieved by RF excitation of the anode 465 from RF power supply line 475. In this case, the plasma itself can act as a virtual anode, or by DC excitation of anode 465.

There is some evidence to suggest that DC excitation results in higher density plasmas. See P. Virostko, Z. Hubicka, P. Adamek, M. Cada, J. Olejnicek, M. Tichy and M. Sicha Contrib. Plasma Phys. 46 (2006) 445-450, which is entirely incorporated herein by reference. In the holes in cathode 445, at certain gas flows and pressures, dependent on the geometry of the holes, a very strong additional plasma can be achieved due to the hollow cathode effect. Any additional plasma created by the hollow cathode effect is contained well above the substrate/sample by ground grid 450, since energetic ions can be damaging to the thin film during film growth.

Various advantages can be achieved using the MEAGlow arrangement. For example, the growth rate of a material at the substrate can be increased compared to normal RPECVD growth. Also, plasma power sources other than microwave sources can be effectively applied. In particular, RF (Radio Frequency) and other lower frequency sources including DC can be used, particularly in the example case of a hollow cathode source.

For MEAGlow, a hollow cathode source can be used under DC conditions and this can be advantageous in terms of obtaining an improved flux of active neutrals. In this particular but non-limiting example, because a microwave source is not used, relatively very large area deposition can be achieved.

In another example embodiment, oxygen contamination can be reduced by using a capacitively coupled parallel plate configuration, to eliminate the oxygen contamination that occurs when a plasma is in contact with dielectric windows. The parallel plate configuration can be used in conjunction with a hollow cathode plasma source to initiate a higher density plasma.

With continued reference to FIG. 4, the plasma processing reactor further comprises a control system 495 for controlling various process parameters and components, such as, for example, the substrate and/or substrate holder temperature, main chamber pressure, the flow rate of plasma gas (e.g., active neutral species of $N_2$), the flow rate of a metalorganic species, the rate at which the substrate rotates during thin film formation, power to the plasma generator (e.g., RF generator), and a vacuum system in fluid communication with the reaction chamber. The control system 495 can further control the pressure of the main chamber 400 and the pressure of the plasma creation region 455. In an embodiment, the control system is configured to alternately and sequentially provide non-overlapping pulses of a metalorganic species (or other Group III metal precursor) and active neutral species of nitrogen into the main chamber during thin film formation.

Figure 5:
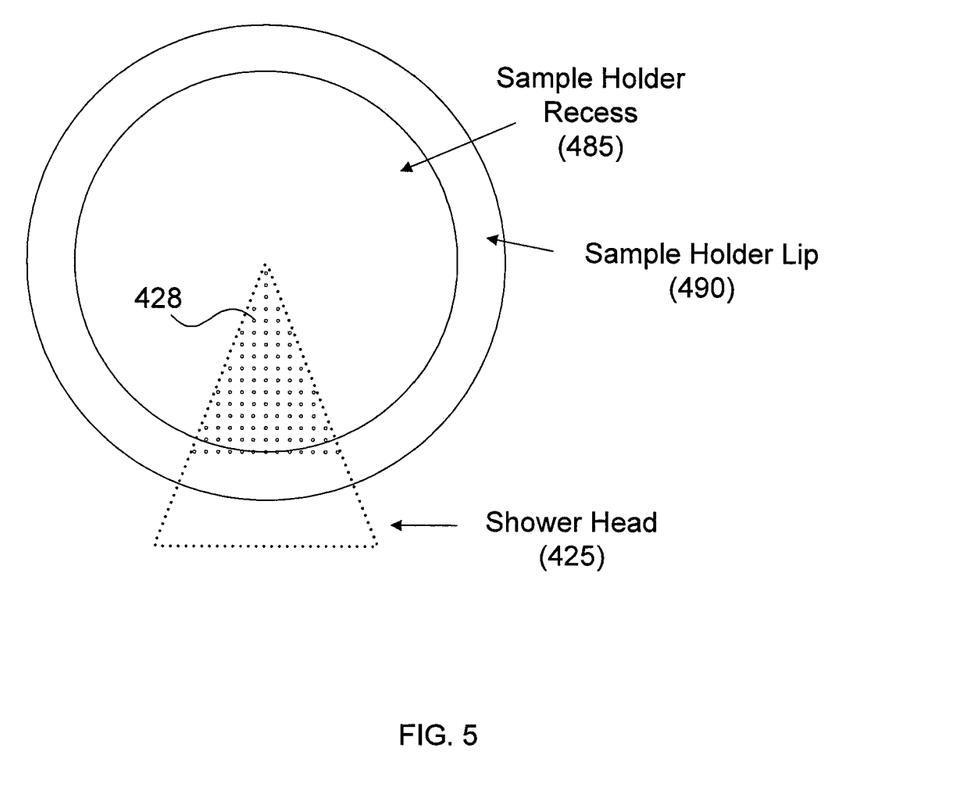
FIG. 5 illustrates a schematic of an example shower head (also "showerhead" herein) feed of a plasma processing reactor, in accordance with an embodiment of the invention.

With reference to FIG. 5, there is illustrated a schematic of an example "shower head" (also "showerhead" herein) feed 425 that can be used in MEAGlow reactor chamber 400. Shower head feed 425 distributes metalorganic species to the substrate/sample. The shower head feed 425 can be located relatively close to the substrate/sample holder 435 as compared to a normal RPECVD system configuration. A preferred hole dispersion pattern for the shower head feed 425 is illustrated in FIG. 4. Holes 428 are formed in a surface of the shower head feed 425 to release metalorganic species. Holes 428 direct metalorganic species 430 onto the substrate/sample. For the purposes of illustration only, a sample holder recess 485 and a sample holder lip 490, being part of substrate holder 435, are illustrated in relative position to shower head feed 425 and holes 428. A typical sample/substrate would be placed within sample holder recess 485. Preferably, substrate holder 435 is rotated about a longitudinal axis so that a substrate/sample rotates under shower head feed 425 and so that metalorganic species is evenly distributed on the substrate/sample.

According to other examples, the metalorganic delivery head can be of various configurations. The metalorganic delivery head may be substantially circular and cover the substrate, with exit holes provided about the circular extent of the head (i.e., a 'showerhead' configuration). This configuration might require the head to be moved (e.g., moved laterally) between pulses of metalorganic species. The metalorganic delivery head may be of a ring-like or annular configuration with exit holes positioned about the ring-like or annular geometry. The metalorganic delivery head may be of a form where the metalorganic species is introduced via a central hole or duct and is dispersed over the substrate by a dispersing mechanism, such as a rotating component creating a centrifugal dispersing action (e.g., a "turbodisc" configuration).

For the deposition of group III nitride semiconductor thin films by ordinary known RPECVD methods, the inventor has found that RF generated plasma supplies operating at 13.56 MHz have not proven particularly effective, with too much dust production being evident. In contrast, 2.45 GHz microwave plasma systems have proven to be more effective with substantially less dust production. It has been reported that for microwave generated plasmas less energy is required to sustain an electron-ion pair. For argon plasmas it has been estimated that 2-7 times less power per electron-ion pair is required at 2.45 GHz than at RF frequencies-dependent upon the discharge conditions. See M. Moisan, C. Barbeau, R. Claude, C. M. Ferreira, J. Margot, J. Paraszczak, A. B. Sa, G. Sauve and M. R. Wertheimer J. Vac. Sci. Technol. B 9 (1991) 8, which is entirely incorporated herein by reference. Hence, there is expected a greater degree of ionisation in a microwave generated plasma compared to an RF generated plasma for a given applied power. The excess energy used to generate an electron-ion pair for the RF case eventually devolves to heat, which would promote gas phase reactions and the formation of dust during ordinary RPECVD film growth. However, as pointed out by Lieberman and Boswell the electron density (and hence the degree of ionization—or electron-ion density) of an RF generated plasma is highly dependent on the means of generation. See M. A. Lieberman and R. W. Boswell, J. Phys. IV France 8 (1998) Pr7-145, which is entirely incorporated herein by reference. Capacitively coupled RF plasma generation (commonly used for semiconductor processing) is the least effective means, with electron-ion densities typically around $10^9$ to $10^{10}$ cm$^{-3}$. See M. A. Lieberman and R. W. Boswell, J. Phys. IV France 8 (1998) Pr7-145, which is entirely incorporated herein by reference. While inductively coupled RF plasmas can typically have densities of $10^{11}$ to $10^{12}$ cm$^{-3}$. See M. A. Lieberman and R. W. Boswell, J. Phys. IV France 8 (1998) Pr7-145, which is entirely incorporated herein by reference. This is similar to the densities achieved by microwave plasma systems (see, e.g., H. Tahara, K. Minami, T. Yasui, K. Onoe, Y. Tsubakishita and T. Yoshikawa, Jpn. J. Appl. Phys. 32 (1993) 1822, which is entirely incorporated herein by reference), though typically less power is used in the case of the microwave source to achieve such densities (see M. Moisan, C. Barbeau, R. Claude, C. M. Ferreira, J. Margot, J. Paraszczak, A. B. Sa, G. Sauve and M. R. Wertheimer J. Vac. Sci. Technol. B 9 (1991) 8, which is entirely incorporated herein by reference). Other types of RF, or lower frequency plasmas, which utilize resonance characteristics, can be even denser. For instance, RF, and lower frequency, hollow cathode plasma sources, can produce high densities of ion-electron pairs. See, e.g., P. Virostko, Z. Hubicka, P. Adamek, M. Cada, J. Olejnicek, M. Tichu and M. Sicha, Contrib. Plasma Phys. 46 (2006) 445, which is entirely incorporated herein by reference.

For PECVD based processes, where substrates are in direct contact with the plasma, a high level of ionic species is usually a positive for plasma processes. This is also the case for RPECVD, and it is important to note that although the active species used in RPECVD film growth is not the ionic species, a greater degree of ionization within the plasma will generally translate into a denser (or more dense) concentration of neutral species in the afterglow region. See S. M. Rossnagel, "Glow Discharge Plasmas and sources for Etching and Deposition", *Thin Film Processes II*, p. 37-38, edited by J. L. Vossen and W. Kern (Academic Press, San Diego, 1991), which is entirely incorporated herein by reference. Some RF based plasma systems may be suitable for RPECVD, if heating of the metalorganic reactants in the gas phase by the plasma source can be avoided.

In the case of RPECVD using a nitrogen gas source for the plasma, the lowest excited state of molecular nitrogen has an extremely long radiative lifetime, estimated to be as high as 2 seconds by some groups (See P. Choi, Y. Kaufman and R. Aliaga, Appl. Phys. Lett. 57 (1990) 440, which is entirely incorporated herein by reference) and is a major contributing species to nitride film growth by RPECVD. For a hollow cathode source this lowest excited molecular nitrogen state has been observed to be present at densities as high as about $4.9 \times 10^{11}$ cm$^{-3}$. See P. Choi, Y. Kaufman and R. Aliaga, Appl. Phys. Lett. 57 (1990) 440, which is entirely incorporated herein by reference. In conventional RPECVD, however, it is known that collisions with some impurity species, including $CH_4$, is gas kinetic and will rapidly quench this form of neutral nitrogen at a rate of up to about 1000 times higher than collisions with molecular nitrogen. See L. G. Piper, J. Chem. Phys. 87 (1987) 1625, which is entirely incorporated herein by reference.

For RPECVD film growth where excited nitrogen molecular neutrals and metalorganic species are present at the same time in the growth system, a notable reduction in the active nitrogen that reaches the substrate can be expected due to quenching caused by collisions with these methyl group species, resulting in a lower then expected growth rate. Gas phase reactions due to the interaction of the metalorganic with the active neutral nitrogen can also be expected. The inventor has observed a strong secondary light emission (chemiluminescence) in the far downstream afterglow of a microwave generated nitrogen plasma when metalorganic is introduced into the system, which suggests that such gas phase interactions are in progress. Using a migration enhanced configuration, where the metalorganic is not introduced at the same time as the active nitrogen should therefore allow a greater proportion of active species to reach the substrate to participate in film growth.

Microwave based plasma generation systems are electrodeless, a strong electromagnetic field in a resonant cavity leads to gas breakdown. A dielectric window is used to transmit the electromagnetic field into the gas system where the plasma is generated, usually at low pressure. It has been found that plasma interaction with the dielectric window can cause contamination of the plasma by species being etched from the window. A lengthy surface passivation cycle, taking as long as two days, in a well evacuated vacuum system that has no exposure to atmosphere is needed to create a nitride layer on the window to overcome this problem, as is outlined in International Patent Publication WO2006/034540, which is entirely incorporated herein by reference. Because of the relatively short wavelengths of microwave sources and the need to have dimensional cavities to sustain the plasma, it is also quite difficult to scale microwave sources for film deposition over large areas.

Although there are some advantages of the use of microwave plasma sources, the use of other sources, such as hollow cathode plasma sources, should allow for easier plasma source scalability and for reduced concern about contamination from windows. The use of a migration enhanced growth scenario would allow other plasma sources to be used without concern for gas heating which can result in enhanced dust formation problems. In particular, hollow cathode sources, which do not employ dielectric windows could be used.

Another advantage of a microwave plasma generation system is the ability to sustain the plasma over a very wide range of pressure. The inventor has been able to sustain a microwave generated nitrogen plasma over a 22 Torr to 10 mTorr range using a system capable of delivering approximately 600 W of power. Other RF and lower frequency (e.g., DC) generated plasmas do not generally have such a broad range of operating pressure. Again, using a migration enhanced methodology allows separate conditions to be used for the application of the metalorganic and the plasma, so that the chamber pressure for the delivery of the active nitrogen can be tailored to the plasma source used. To prevent high energy neutral species (such as atomic nitrogen) from reaching the substrate (which can happen at too low a growth pressure) the flow rate from the plasma source can be reduced and the distance from the plasma to the substrate can be adjusted, instead of adjusting the chamber pressure. This can provide a balance between having a high density of low energy active neutral species for film growth, while minimizing the presence of higher energy damaging species, which can affect film quality and reduce the growth rate through etching.

The delivery of the metalorganic for a migration enhanced film growth regime can be optimized to enable a higher delivery rate to the substrate. The gas head for the metalorganic can be positioned quite close to the substrate holder, and relatively low delivery pressures can be used to increase the utilization of the metalorganic. The requirement for uniform radial and axial delivery in the chamber, necessary during conventional RPECVD film growth, can be relaxed for film growth in a MEAGlow reactor, with only radial uniformity being a necessary condition for design of the metalorganic delivery head.

During normal RPECVD film growth, rotation is used to "smooth out" small non-uniformities that occur axially, but because film growth is continuous during the process, uniform conditions are required to maintain uniform film properties that would otherwise be grown into the film. In contrast, for a MEAGlow reactor, the film growth only occurs during the application of the plasma. Metalorganic delivery can therefore occur along a radius of the substrate holder so long as rotation of the substrate under that radius is rapid enough to provide uniform coverage of the substrate by the metal while the plasma source is off. The configuration of the metalorganic vapor delivery head can therefore be greatly simplified. Continued rotation while the plasma is on and the metalorganic is off ensures that any shadowing by the delivery head is not detrimental in terms of ensuring migration enhanced epitaxy occurs, and a uniform layer is deposited over the plasma on period.

Figure 6:
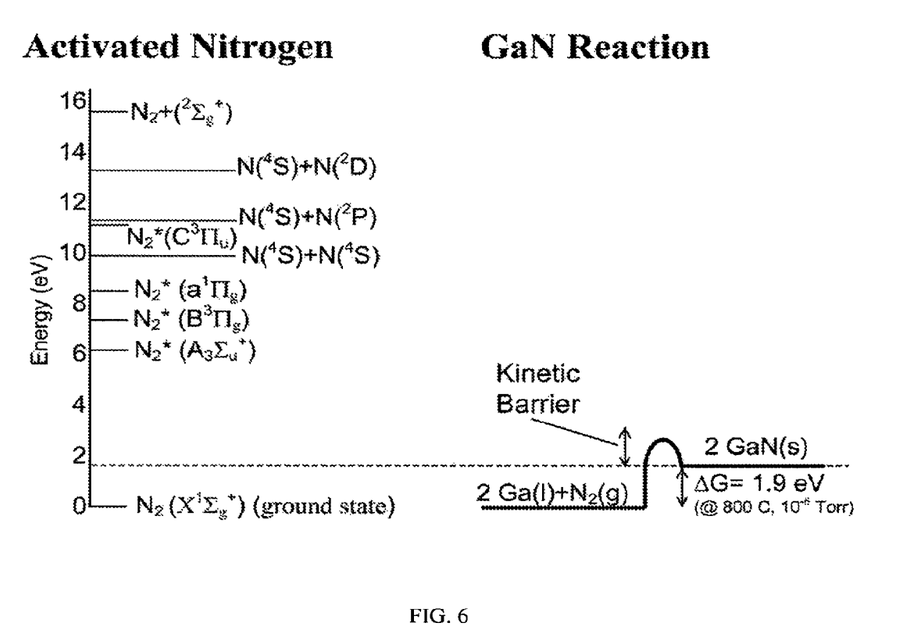
FIG. 6 is potential energy diagram for activated nitrogen, in accordance with an embodiment of the invention.

With reference to FIG. 6, an energy diagram showing various active nitrogen species and their respective potential energies is shown, in accordance with an embodiment of the invention. The lowest excited state of molecular nitrogen, $A^3\Sigma_u^+$, has a potential energy between about 6 eV and 7 eV. The plot on the right shows the kinetic barrier for the formation of gallium nitride (GaN) from gallium and $N_2(g)$. The change in free energy upon formation of GaN is about 1.9 eV.

Figure 7A:
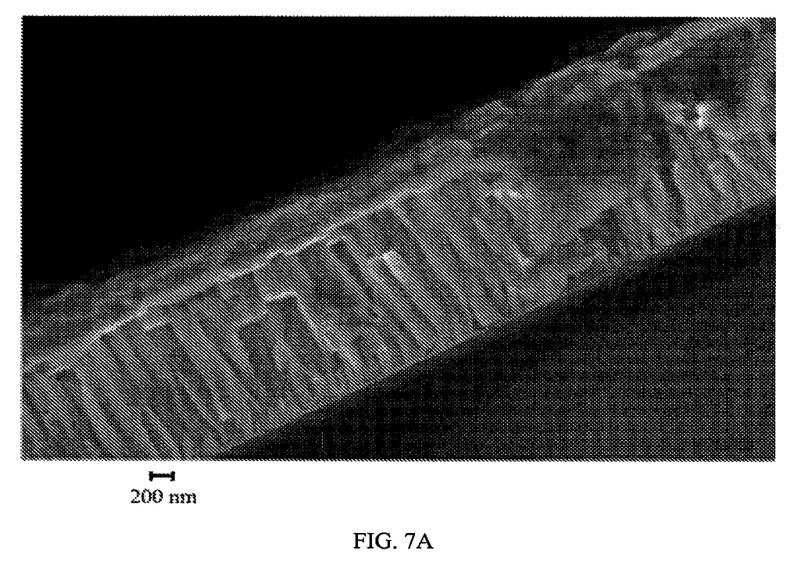
FIG. 7A shows an image of an InN film grown with evidence of migration enhanced epitaxy on the top layer, in accordance with an embodiment of the invention.
Figure 7B:
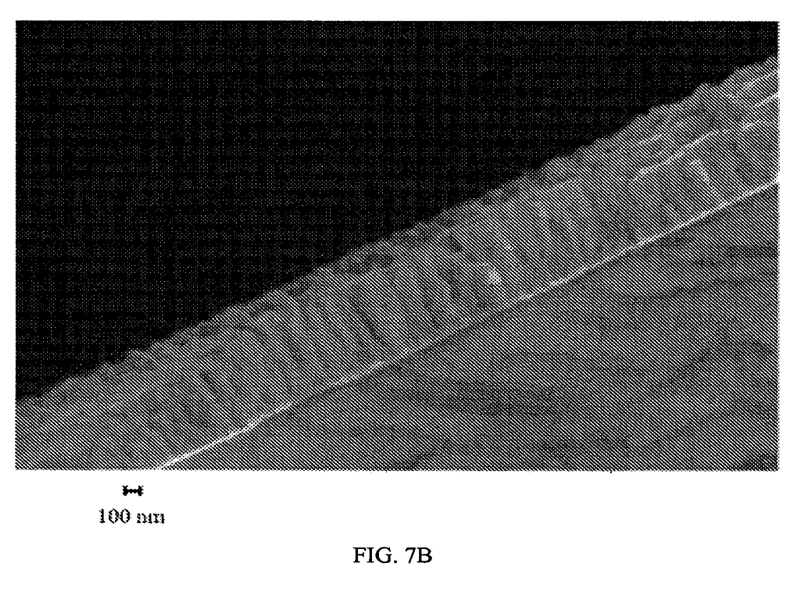
FIG. 7B shows an image of an InN film grown with no evidence of a migration enhanced top layer, in accordance with an embodiment of the invention.

With reference to FIG. 7A, there is shown by way of example only an image of an instance of migration enhanced type growth for an InN film grown in a RPECVD type reactor. The substrate is shown at the bottom of the figure, above which is the largely polycrystalline film, shown at roughly a 30 degree angle to the horizontal with columnar growth typical of a hexagonal crystal structure being evident. At the top surface region of the film, however, the columnar crystals are terminated with an apparently single crystal layer where lateral film growth has been greatly enhanced. In contrast, with reference to FIG. 7B, there is shown by way of example only an image of an instance of non-migration enhanced type growth for an InN film grown in a RPECVD type reactor. There is no evidence of a top laterally grown layer.

Methods and plasma reactor devices of embodiments of the invention, including MEAGlow systems, are capable of achieving an increased rate of thin film growth while reducing, if not eliminating, dust formation problems compared to conventional PECVD or RPECVD systems and methods. A reduction of dust formation problems and improved crystallinity due to improved lateral growth can be expected in MEAGlow compared to conventional RPECVD. The film growth rate improvement for MEAGlow can occur because of the use of higher fluxes of the precursor materials, without dust formation problems. Growth rate improvement for MEAGlow is also expected because the active neutral plasma species is not consumed by impurities in the gas phase, in particular by a metalorganic precursor material, i.e., more of the active species make it to the substrate region for a given flux of these active species.

For MEAGlow, plasma sources other than RF or microwave plasma sources can be used because gas heating by the plasma source is less of an issue (powder production is reduced regardless). Because the conditions for delivery of a metalorganic cation and a plasma-generated anion are not congruent the conditions for the delivery of each precursor can be independently optimized. This also enables a simplified metalorganic delivery head to be used for MEAGlow compared to RPECVD, or MOCVD. The chamber pressure during the delivery of the metalorganic cation can also be greatly reduced so that the use of a carrier gas with the metalorganic (as is typically used for RPECVD, MOCVD and PECVD) is not necessary. The metalorganic can be delivered as a pure vapor using a much simplified gas delivery system for which carrier mixing with the metalorganic is not required.

Example

A sapphire substrate was provided in a reaction chamber (such as the reaction chamber of FIG. 4) of a plasma processing reactor. The plasma processing reactor included a plasma generator for forming active neutral species of nitrogen. Trimethylgallium was supplied to the reaction chamber at a pressure of about 0.1 Torr for a time period of about 1 minute. The substrate was maintained at a temperature of about 500° C., a temperature above the decomposition temperature of trimethylgallium. Under such conditions, gallium metal deposited on the surface of the sapphire substrate via the decomposition of the trimethylgallium. The flow rate of nitrogen was about 50 standard cubic centimeters ("sccm") from the plasma source during the deposition of gallium. No power was provided to the plasma generator (i.e., no active neutral species of nitrogen were formed) during the deposition of gallium on the sapphire surface.

After about 1 minute, the flow of trimethylgallium into the reaction chamber was terminated. Next, the nitrogen flow through the plasma source (or plasma generator) was increased to about 500 sccm. The pressure in the chamber was increased to 3 Torr and plasma was struck with a DC source operating at 200 W to generate active neutral species of nitrogen, which was directed at the substrate in the reaction chamber. The sapphire substrate (and the gallium thin film on the sapphire substrate) was exposed to active neutral species of nitrogen for about 1 minute, at which point the DC source was turned off and the nitrogen flow rate was reduced to about 50 sccm. The active neutral species of nitrogen saturated the gallium on the substrate and precipitated a GaN thin film (i.e., the Ga thin film was converted to a GaN thin film). The steps of alternately and sequentially directing into the reactor trimethylgallium and active neutral species of nitrogen were repeated 30 times to form a gallium nitride thin film having a thickness of about 1000 nanometers.

Optional embodiments of the present invention may also be said to broadly consist in the parts, elements and features referred to or indicated herein, individually or collectively, in any or all combinations of two or more of the parts, elements or features, and wherein specific integers are mentioned herein which have known equivalents in the art to which the invention relates, such known equivalents are deemed to be incorporated herein as if individually set forth.

Although various embodiments have been described in detail, it should be understood that various changes, substitutions, and alterations can be made by one of ordinary skill in the art without departing from the scope of the present invention.

It will be appreciated that methods, apparatuses and systems of embodiments of the invention can be used to form metal oxides. In such a case, plasma activated species of oxygen can be supplied to the reaction chamber having a substrate.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A plasma processing reactor, comprising:
a substrate holder positioned within a chamber for holding a substrate;
a cation species feed to direct a supply of a cation precursor towards the substrate, the cation species feed positioned adjacent to the substrate;
an anion species feed to direct a supply of an anion precursor towards a plasma creation region in which a supply of a plasma based anion species can be created as at least part of a plasma; and
a hollow cathode positioned between an anode and the cation species feed, the hollow cathode and the anode providing a capacitively coupled configuration, and the plasma creation region is at least partially between the hollow cathode and the anode,
wherein, the supply of the cation precursor and the supply of the plasma based anion species to the substrate are intermittently modulated.

2. The plasma processing reactor as claimed in claim 1, wherein the capacitively coupled configuration of the hollow cathode and the anode create the plasma without a dielectric window.

3. The plasma processing reactor as claimed in claim 2, wherein the hollow cathode generates the plasma using an electrical source selected from the group consisting of a radiofrequency (RF) source, a lower frequency source, and a direct current (DC) source.

4. The plasma processing reactor as claimed in claim 3, wherein the plasma is scalable to a relatively large area.

5. The plasma processing reactor as claimed in claim 1, including a grid positioned between the hollow cathode and the cation species feed.

6. The plasma processing reactor as claimed in claim 1, wherein the plasma based anion species is able to flow through the hollow cathode to the vicinity of the substrate.

7. The plasma processing reactor as claimed in claim 1, wherein the cation precursor is a metalorganic species.

8. The plasma processing reactor as claimed in claim 1, wherein the cation species feed partially covers a surface of the substrate, and the substrate is rotated beneath the cation species feed.

9. A reactor, comprising:
a reaction chamber;
a substrate holder disposed in the reaction chamber, the substrate holder configured to hold a substrate;
a plasma generator in fluid communication with a nitrogen ($N_2$) feed and the reaction chamber, the plasma generator configured to form active neutral species of nitrogen as at least part of a plasma, and the plasma generator comprising a hollow cathode and an anode, the hollow cathode positioned between the anode and the substrate, the hollow cathode and the anode providing a capacitively coupled configuration, and the plasma at least partially created between the hollow cathode and the anode; and
a control system configured to alternately and sequentially provide into the reaction chamber a Group III metal precursor and active neutral species of nitrogen.

10. The reactor of claim 9, wherein the plasma generator comprises a gas distribution member for providing active neutral species of nitrogen to the reaction chamber.

11. The reactor of claim 10, wherein the gas distribution member comprises a plurality of holes in a showerhead configuration.

12. The reactor of claim 10, wherein the gas distribution member comprises one or more hollow cathodes.

13. The reactor of claim 10, wherein the gas distribution member is configured to form a group of active neutral species of nitrogen having potential energies less than or equal to 7 eV.

14. The reactor of claim 9, further comprising a Group III metal precursor feed for directing a Group III metal precursor to the reaction chamber.

15. The reactor of claim 14, wherein the Group III metal precursor feed is disposed adjacent the substrate holder.

16. The reactor of claim 14, wherein the Group III metal precursor feed is disposed between the substrate holder and the plasma generator.

17. The reactor of claim 14, wherein the capacitively coupled configuration of the hollow cathode and the anode create the plasma without a dielectric window.

18. The plasma processing reactor as claimed in claim 1, wherein the capacitively coupled configuration of the hollow cathode and the anode reduce or eliminate oxygen contamination in the plasma creation region that would otherwise occur if the plasma was created using a dielectric window.

* * * * *